(12) United States Patent
Song et al.

(10) Patent No.: US 8,569,946 B2
(45) Date of Patent: Oct. 29, 2013

(54) ORGANIC LIGHT EMITTING DISPLAY HAVING A SINGLE-LAYERED ANTI-REFLECTION LAYER OF ALUMINUM FLUORIDE AND METHOD OF FABRICATING THE SAME

(75) Inventors: Seung Yong Song, Yongin-si (KR); Jin Woo Park, Yongin-si (KR); Young Seo Choi, Yongin-si (KR); Young Cheol Zu, Yongin-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 886 days.

(21) Appl. No.: 11/540,150

(22) Filed: Sep. 29, 2006

(65) Prior Publication Data

US 2013/0234115 A1    Sep. 12, 2013

(30) Foreign Application Priority Data

Jan. 25, 2006 (KR) .................. 10-2006-0007890

(51) Int. Cl.
*H01J 1/62* (2006.01)
(52) U.S. Cl.
USPC .............. 313/504; 313/507; 313/512; 445/24
(58) Field of Classification Search
CPC .. H01L 21/276; G02F 1/133502; G03F 7/091
USPC .................. 313/502–507; 369/112.23, 118; 349/106, 137
See application file for complete search history.

(56) References Cited

U.S. PATENT DOCUMENTS

| 4,238,704 A | 12/1980 | Bonk et al. | |
| 6,472,087 B1 * | 10/2002 | Otani et al. | 428/696 |
| 6,555,025 B1 | 4/2003 | Krupetsky et al. | |
| 6,744,199 B1 * | 6/2004 | Tanaka | 313/512 |
| 6,924,594 B2 * | 8/2005 | Ogura et al. | 313/506 |
| 6,998,776 B2 | 2/2006 | Aitken et al. | |
| 2003/0184221 A1 | 10/2003 | Mishima | |
| 2004/0256979 A1 * | 12/2004 | Murakami et al. | 313/503 |
| 2005/0127820 A1 * | 6/2005 | Yamazaki et al. | 313/501 |
| 2005/0174046 A1 * | 8/2005 | Hasegawa et al. | 313/504 |
| 2005/0231107 A1 * | 10/2005 | Yamazaki et al. | 313/506 |

(Continued)

FOREIGN PATENT DOCUMENTS

EP    1582914 A1 * 10/2005
JP    09-278483      10/1997

(Continued)

OTHER PUBLICATIONS

Ishikawa, takeshi, Japanese Patent Application Publication2001-230072,Aug. 2001 machine translation.*

(Continued)

*Primary Examiner* — Tracie Y Green
(74) *Attorney, Agent, or Firm* — Knobbe Martens Olson & Bear LLP

(57) ABSTRACT

An organic light emitting display device includes a first substrate including a pixel region in which at least one organic light emitting diode including a first electrode, an organic layer, and a second electrode is formed and a non-pixel region formed beside the pixel region. The device includes a second substrate and a frit provided between the non-pixel region on the first substrate and the second substrate. A reflection prevention layer is formed on at least one surface of the second substrate.

16 Claims, 7 Drawing Sheets

(56) References Cited

U.S. PATENT DOCUMENTS

2005/0233885 A1   10/2005  Yoshida et al.
2005/0258744 A1*  11/2005  Kwak et al. .................. 313/504
2005/0275342 A1*  12/2005  Yanagawa ................... 313/504
2006/0082298 A1    4/2006  Becken et al.
2006/0261336 A1*  11/2006  Ohnuma et al. ............... 257/59

FOREIGN PATENT DOCUMENTS

| JP | 10-074583 | 3/1998 |
| JP | 2001-230072 A | 8/2001 |
| JP | 2003-332061 | 11/2003 |

OTHER PUBLICATIONS

Office Action from corresponding Korean Patent Application No. 10-2006-007890.

An Office Action dated Jul. 28, 2009 of the Japanese Patent Application No. 2006-153567, which claims priority of the corresponding Korean priority application No. 10-2006-0008462.

* cited by examiner

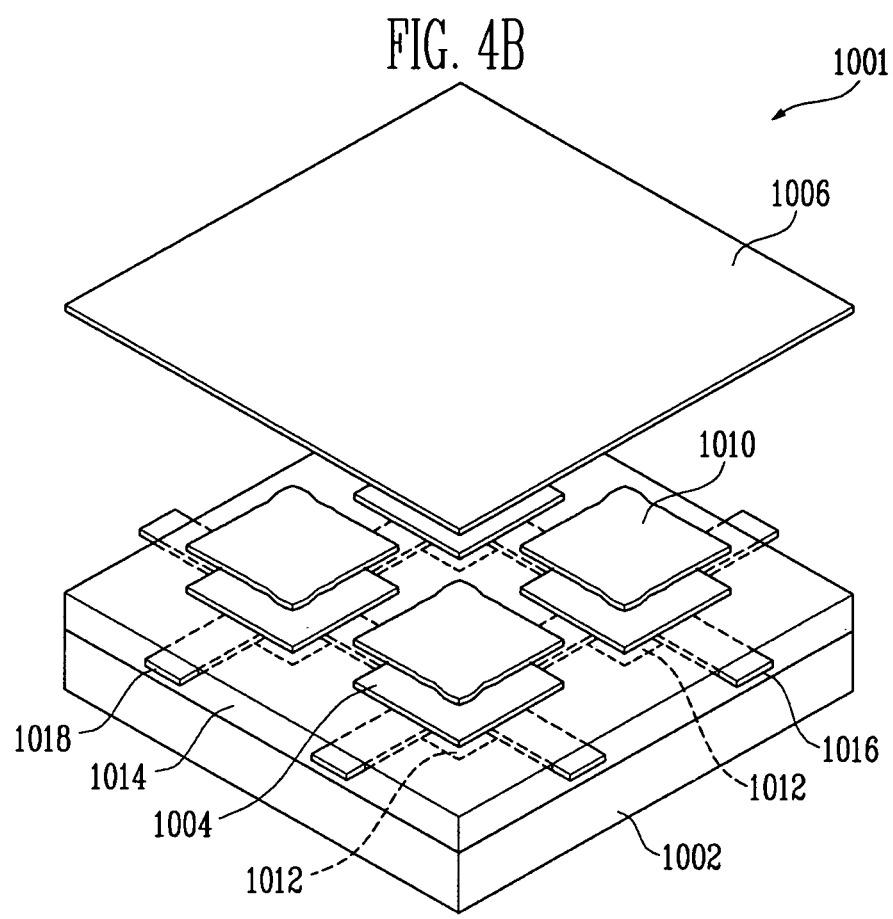

ORGANIC LIGHT EMITTING DISPLAY HAVING A SINGLE-LAYERED ANTI-REFLECTION LAYER OF ALUMINUM FLUORIDE AND METHOD OF FABRICATING THE SAME

CROSS-REFERENCE TO RELATED APPLICATIONS

This application claims the benefit of Korean Patent Application No. 10-2006-0007890, filed on Jan. 25, 2006, in the Korean Intellectual Property Office, the disclosure of which is incorporated herein by reference in its entirety. This application is related to and incorporates herein by reference the entire contents of the following concurrently filed applications:

| Title | Filing Date | Application No. |
|---|---|---|
| ORGANIC LIGHT-EMITTING DISPLAY DEVICE AND METHOD OF FABRICATING THE SAME | Sep. 29, 2006 | 11/541,055 |
| ORGANIC LIGHT-EMITTING DISPLAY DEVICE AND METHOD OF MANUFACTURING THE SAME | Sep. 29, 2006 | 11/529,914 |
| ORGANIC LIGHT EMITTING DISPLAY DEVICE | Sep. 29, 2006 | 11/541,139 |
| ORGANIC LIGHT-EMITTING DISPLAY DEVICE WITH FRIT SEAL AND REINFORCING STRUCTURE | Sep. 29, 2006 | 11/541,047 |
| ORGANIC LIGHT EMITTING DISPLAY AND METHOD OF FABRICATING THE SAME | Sep. 29, 2006 | 11/541,009 |
| ORGANIC LIGHT-EMITTING DISPLAY DEVICE WITH FRIT SEAL AND REINFORCING STRUCTURE BONDED TO FRAME | Sep. 29, 2006 | 11/540,151 |
| METHOD FOR PACKAGING ORGANIC LIGHT EMITTING DISPLAY WITH FRIT SEAL AND REINFORCING STRUCTURE | Sep. 29, 2006 | 11/529,910 |
| METHOD FOR PACKAGING ORGANIC LIGHT EMITTING DISPLAY WITH FRIT SEAL AND REINFORCING STRUCTURE | Sep. 29, 2006 | 11/540,084 |
| ORGANIC LIGHT-EMITTING DISPLAY DEVICE AND THE PREPARATION METHOD OF THE SAME | Sep. 29, 2006 | 11/540,008 |
| ORGANIC LIGHT EMITTING DISPLAY AND FABRICATING METHOD OF THE SAME | Sep. 29, 2006 | 11/541,048 |
| ORGANIC LIGHT-EMITTING DISPLAY AND METHOD OF MAKING THE SAME | Sep. 29, 2006 | 11/540,021 |
| ORGANIC LIGHT EMITTING DISPLAY AND FABRICATING METHOD OF THE SAME | Sep. 29, 2006 | 11/540,024 |
| ORGANIC LIGHT EMITTING DISPLAY DEVICE AND MANUFACTURING METHOD THEREOF | Sep. 29, 2006 | 11/529,995 |
| ORGANIC LIGHT-EMITTING DISPLAY DEVICE AND MANUFACTURING METHOD OF THE SAME | Sep. 29, 2006 | 11/540,157 |
| ORGANIC LIGHT EMITTING DISPLAY AND FABRICATING METHOD OF THE SAME | Sep. 29, 2006 | 11/540,149 |
| ORGANIC LIGHT EMITTING DISPLAY AND METHOD OF FABRICATING THE SAME | Sep. 29, 2006 | 11/529,916 |
| ORGANIC LIGHT EMITTING DISPLAY DEVICE METHOD OF FABRICATING THE SAME | Sep. 29, 2006 | 11/529,891 |
| ORGANIC LIGHT EMITTING DISPLAY DEVICE METHOD OF FABRICATING THE SAME | Sep. 29, 2006 | 11/540,103 |

BACKGROUND

1. Field of the Invention

The present invention relates to organic light emitting display devices and, more particularly, to packaging such devices.

2. Discussion of Related Art

Recently, organic light emitting displays that use organic light emitting diodes are spotlighted. The organic light emitting displays are spontaneous emission displays that electrically excite phosphorous organic compounds to emit light and can be driven at a low voltage, can be easily made thin, and have a wide view angle and high response speed.

The organic light emitting display includes a plurality of pixels that include organic light emitting diodes that are formed on a substrate and thin film transistors (TFT) for driving the organic light emitting diodes. The organic light emitting diodes are sensitive to moisture. Therefore, a sealing structure in which moisture is prevented from contacting the organic materials by using a metal cap coated with an absorbent or a sealing glass substrate is provided. U.S. Pat. No. 6,998,776 B2 discloses that an organic light-emitting display includes a first substrate plate, a second substrate plate and a frit connecting the plates.

SUMMARY OF CERTAIN INVENTIVE ASPECTS

An aspect of an organic light emitting display device, which may comprises: a first substrate comprising a single layer or multiple layers; a second substrate comprising a single layer or multiple layers, the second substrate comprising an inner surface facing the first substrate and an outer surface facing away from the first substrate; an array of organic light emitting pixels formed on the first substrate and interposed between the first and second substrates, the array comprising a top surface opposing the inner surface of the second substrate, wherein the top surface and the inner surface has a gap therebetween with a gap distance smaller than about 300 μm; a frit seal interconnecting the first and second substrates while surrounding the array, wherein the frit seal, the first substrate and the second substrate in combination define an enclosed space in which the array is located; and an antireflection layer formed over at least one of the inner and outer surfaces of the second substrate.

In the foregoing device, the antireflection layer may comprise a material having a reflectance for visible light smaller than the second substrate. The gap distance may be smaller than about 100 μm. The gap distance may be smaller than about 10 μm. The gap distance is from about 3 μm to about 150 μm. The antireflection layer may form on the outer surface of the second substrate. The antireflection layer may form on the inner surface of the second substrate. The antireflection layer may comprise at least one material selected from the group consisting of $MgF_2$, NaF and $AlF_3$. The antireflection layer may comprise at least two sublayers, each of which comprises a different material from each other. The antireflection layer may comprise a sublayer comprising ZnS or $TiO_2$ and another sublayer comprising $SiO_2$. The array may be configured to emit visible light through the top surface. The frit seal may comprise one or more materials selected from the group consisting of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate.

Another aspect of the invention provides a method of making an organic light emitting display device, which may comprise: providing an unfinished device comprising a first substrate and an array of organic light emitting pixels formed on the first substrate, the array comprising a top surface facing away from the first substrate; providing a second substrate and an antireflection layer, the second substrate comprises an inner surface and an outer surface, wherein the antireflection layer is formed on at least one of the inner and outer surfaces; arranging the second substrate over the unfinished device such that the inner surface opposes the array and that the array is interposed between the first and second substrates, wherein the array and the inner surface forms a gap therebetween; and forming a frit seal between and interconnecting the first and second substrates while surrounding the array such that the gap distance is smaller than about 300 µm.

In the foregoing method, wherein forming the frit seal may comprise interposing a frit material between the first and second substrate, and bonding the frit material to the first and second substrate so as to form a substantially hermetic seal. The frit seal may have a height measured between the first and second substrate, wherein the height may be from about 2 µm to about 30 µm. The gap distance may be about 3 to about 150 µm. The gap distance may be smaller than 10 µm. The organic light emitting device may be configured to display an image on the outer surface substantially free of Newton's rings.

Still in the foregoing method, the unfinished device may further comprise a plurality of additional arrays of organic light emitting pixels formed on the first substrate, wherein the method may further comprise forming a plurality of additional seals between and interconnecting the first and second substrates, wherein a first one of the additional seals may surround a first one of the additional arrays. The first additional array and the second substrate may form a gap therebetween with a gap distance smaller than about 300 µm. The antireflection layer may comprise at least one material selected from the group consisting of $MgF_2$, NaF and $AlP_3$. The antireflection layer may comprise a sublayer comprising ZnS or $TiO_2$ and another sublayer comprising $SiO_2$.

Still another aspect of the present invention provides an organic light emitting display, which may comprise a first substrate including a pixel region in which at least one organic light emitting diode including a first electrode, an organic layer, and a second electrode is formed and a non-pixel region formed beside the pixel region, a second substrate formed on one region including the pixel region on the first substrate, a frit provided between the non-pixel region on the first substrate and the second substrate to seal the first substrate and the second substrate to each other, and a reflection prevention layer formed on at least one surface of the second substrate.

Further aspect of the present invention provides a method of fabricating an organic light emitting display comprising a first substrate comprising a pixel region in which at least one organic light emitting diode is formed and a non-pixel region formed beside the pixel region and a second substrate formed on one region comprising the pixel region on the first substrate, which may comprise the steps of forming a reflection prevention layer in at least one region of the second substrate, applying a frit on one region of the second substrate to sinter the frit at a predetermined temperature, attaching the first substrate and the second substrate to each other, and melting the frit to adhere the first substrate and the second substrate to each other.

BRIEF DESCRIPTION OF THE DRAWINGS

These and other features and advantages of the invention will become apparent and more readily appreciated from the following description of the embodiments, taken in conjunction with the accompanying drawings of which:

FIG. 4B is a schematic exploded view of an active matrix type organic light emitting display device in accordance with one embodiment;

DETAILED DESCRIPTION OF EMBODIMENTS

Hereinafter, embodiments according to the present invention will be described with reference to the accompanying drawings.

An organic light emitting display (OLED) is a display device comprising an array of organic light emitting diodes. Organic light emitting diodes are solid state devices which include an organic material and are adapted to generate and emit light when appropriate electrical potentials are applied.

Figure 4A:
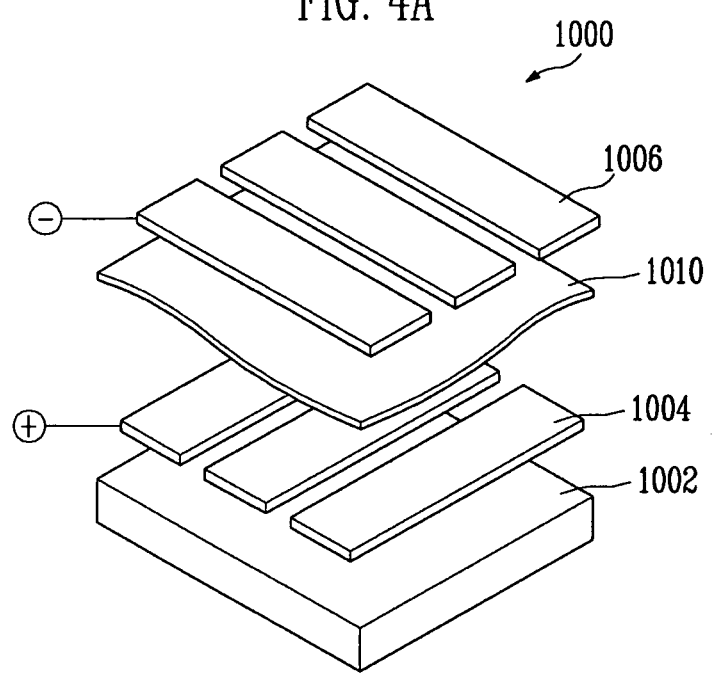
FIG. 4A is a schematic exploded view of a passive matrix type organic light emitting display device in accordance with one embodiment.

OLEDs can be generally grouped into two basic types dependent on the arrangement with which the stimulating electrical current is provided. FIG. 4A schematically illustrates an exploded view of a simplified structure of a passive matrix type OLED 1000. FIG. 4B schematically illustrates a simplified structure of an active matrix type OLED 1001. In both configurations, the OLED 1000, 1001 includes OLED pixels built over a substrate 1002, and the OLED pixels include an anode 1004, a cathode 1006 and an organic layer 1010. When an appropriate electrical current is applied to the anode 1004, electric current flows through the pixels and visible light is emitted from the organic layer.

Referring to FIG. 4A, the passive matrix OLED (PMOLED) design includes elongate strips of anode 1004 arranged generally perpendicular to elongate strips of cathode 1006 with organic layers interposed therebetween. The intersections of the strips of cathode 1006 and anode 1004 define individual OLED pixels where light is generated and emitted upon appropriate excitation of the corresponding strips of anode 1004 and cathode 1006. PMOLEDs provide the advantage of relatively simple fabrication.

Referring to FIG. 4B, the active matrix OLED (AMOLED) includes driving circuits 1012 arranged between the substrate 1002 and an array of OLED pixels. An individual pixel of AMOLEDs is defined between the common cathode 1006 and an anode 1004, which is electrically isolated from other anodes. Each local driving circuit 1012 is coupled with an anode 1004 of the OLED pixels and further coupled with a data line 1016 and a scan line 1018. In embodiments, the scan lines 1018 supply scan signals that select rows of the driving circuits, and the data lines 1016 supply data signals for particular driving circuits. The data signals and scan signals stimulate the local driving circuits 1012, which excite the anodes 1004 so as to emit light from their corresponding pixels.

In the illustrated AMOLED, the local driving circuits 1012, the data lines 1016 and scan lines 1018 are buried in a planarization layer 1014, which is interposed between the pixel array and the substrate 1002. The planarization layer 1014 provides a planar top surface on which the organic light emitting pixel array is formed. The planarization layer 1014 may be formed of organic or inorganic materials, and formed of two or more layers although shown as a single layer. The local driving circuits 1012 are typically formed with thin film transistors (TFT) and arranged in a grid or array under the OLED pixel array. The local driving circuits 1012 may be at least partly made of organic materials, including organic TFT. AMOLEDs have the advantage of fast response time improving their desirability for use in displaying data signals. Also, AMOLEDs have the advantages of consuming less power than passive matrix OLEDs.

Referring to common features of the PMOLED and AMOLED designs, the substrate 1002 provides structural support for the OLED pixels and circuits. In various embodiments, the substrate 1002 can comprise rigid or flexible materials as well as opaque or transparent materials, such as plastic, glass, and/or foil. As noted above, each OLED pixel or diode is formed with the anode 1004, cathode 1006 and organic layer 1010 interposed therebetween. When an appropriate electrical current is applied to the anode 1004, the cathode 1006 injects electrons and the anode 1004 injects holes. In certain embodiments, the anode 1004 and cathode 1006 are inverted; i.e., the cathode is formed on the substrate 1002 and the anode is opposingly arranged.

Interposed between the cathode 1006 and anode 1004 are one or more organic layers. More specifically, at least one emissive or light emitting layer is interposed between the cathode 1006 and anode 1004. The light emitting layer may comprise one or more light emitting organic compounds. Typically, the light emitting layer is configured to emit visible light in a single color such as blue, green, red or white. In the illustrated embodiment, one organic layer 1010 is formed between the cathode 1006 and anode 1004 and acts as a light emitting layer. Additional layers, which can be formed between the anode 1004 and cathode 1006, can include a hole transporting layer, a hole injection layer, an electron transporting layer and an electron injection layer.

Hole transporting and/or injection layers can be interposed between the light emitting layer 1010 and the anode 1004. Electron transporting and/or injecting layers can be interposed between the cathode 1006 and the light emitting layer 1010. The electron injection layer facilitates injection of electrons from the cathode 1006 toward the light emitting layer 1010 by reducing the work function for injecting electrons from the cathode 1006. Similarly, the hole injection layer facilitates injection of holes from the anode 1004 toward the light emitting layer 1010. The hole and electron transporting layers facilitate movement of the carriers injected from the respective electrodes toward the light emitting layer.

In some embodiments, a single layer may serve both electron injection and transportation functions or both hole injection and transportation functions. In some embodiments, one or more of these layers are lacking. In some embodiments, one or more organic layers are doped with one or more materials that help injection and/or transportation of the carriers. In embodiments where only one organic layer is formed between the cathode and anode, the organic layer may include not only an organic light emitting compound but also certain functional materials that help injection or transportation of carriers within that layer.

There are numerous organic materials that have been developed for use in these layers including the light emitting layer. Also, numerous other organic materials for use in these layers are being developed. In some embodiments, these organic materials may be macromolecules including oligomers and polymers. In some embodiments, the organic materials for these layers may be relatively small molecules. The skilled artisan will be able to select appropriate materials for each of these layers in view of the desired functions of the individual layers and the materials for the neighboring layers in particular designs.

In operation, an electrical circuit provides appropriate potential between the cathode 1006 and anode 1004. This results in an electrical current flowing from the anode 1004 to the cathode 1006 via the interposed organic layer(s). In one embodiment, the cathode 1006 provides electrons to the adjacent organic layer 1010. The anode 1004 injects holes to the organic layer 1010. The holes and electrons recombine in the organic layer 1010 and generate energy particles called "excitons." The excitons transfer their energy to the organic light emitting material in the organic layer 1010, and the energy is used to emit visible light from the organic light emitting material. The spectral characteristics of light generated and emitted by the OLED 1000, 1001 depend on the nature and composition of organic molecules in the organic layer(s). The composition of the one or more organic layers can be selected to suit the needs of a particular application by one of ordinary skill in the art.

OLED devices can also be categorized based on the direction of the light emission. In one type referred to as "top emission" type, OLED devices emit light and display images through the cathode or top electrode 1006. In these embodiments, the cathode 1006 is made of a material transparent or at least partially transparent with respect to visible light. In certain embodiments, to avoid losing any light that can pass through the anode or bottom electrode 1004, the anode may be made of a material substantially reflective of the visible light. A second type of OLED devices emits light through the anode or bottom electrode 1004 and is called "bottom emission" type. In the bottom emission type OLED devices, the anode 1004 is made of a material which is at least partially transparent with respect to visible light. Often, in bottom emission type OLED devices, the cathode 1006 is made of a material substantially reflective of the visible light. A third type of OLED devices emits light in two directions, e.g. through both anode 1004 and cathode 1006. Depending upon the direction(s) of the light emission, the substrate may be formed of a material which is transparent, opaque or reflective of visible light.

Figure 4C:
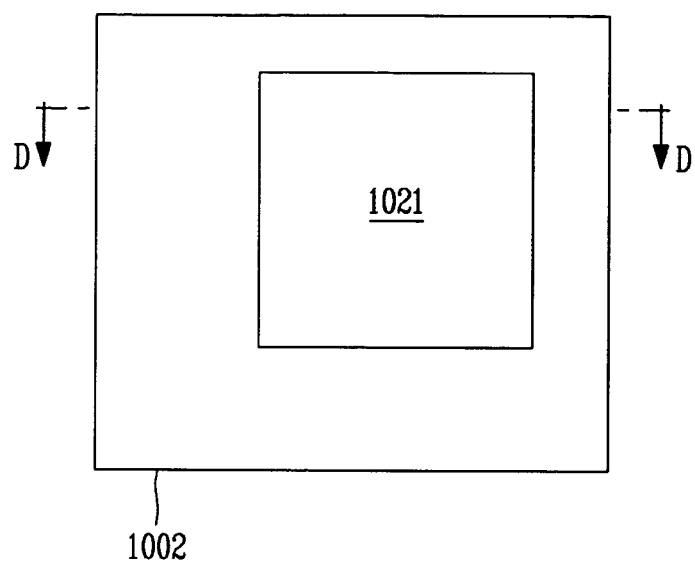
FIG. 4C is a schematic top plan view of an organic light emitting display in accordance with one embodiment.

In many embodiments, an OLED pixel array 1021 comprising a plurality of organic light emitting pixels is arranged over a substrate 1002 as shown in FIG. 4C. In embodiments, the pixels in the array 1021 are controlled to be turned on and off by a driving circuit (not shown), and the plurality of the pixels as a whole displays information or image on the array 1021. In certain embodiments, the OLED pixel array 1021 is arranged with respect to other components, such as drive and control electronics to define a display region and a non-display region. In these embodiments, the display region refers to the area of the substrate 1002 where OLED pixel array 1021 is formed. The non-display region refers to the remaining areas of the substrate 1002. In embodiments, the non-display region can contain logic and/or power supply circuitry. It will be understood that there will be at least portions of control/drive circuit elements arranged within the display region. For example, in PMOLEDs, conductive components will extend into the display region to provide appropriate potential to the anode and cathodes. In AMOLEDs, local driving circuits and data/scan lines coupled with the driving circuits will extend into the display region to drive and control the individual pixels of the AMOLEDs.

Figure 4D:
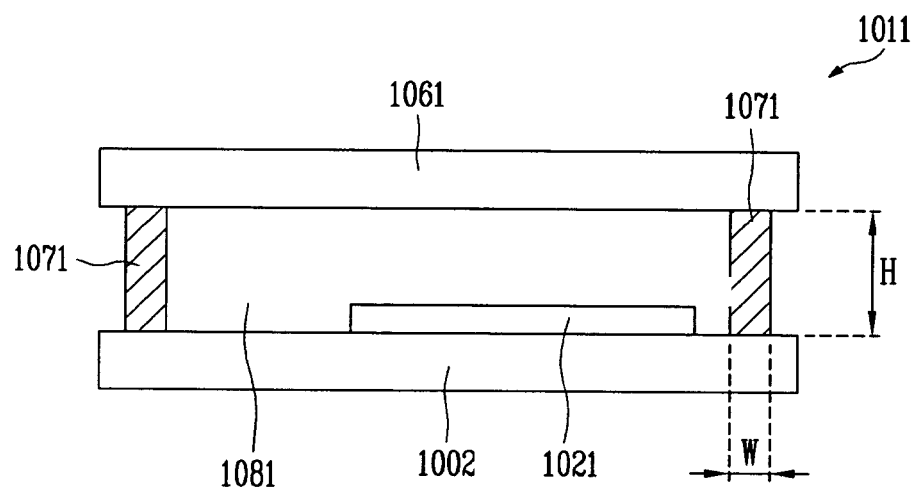
FIG. 4D is a cross-sectional view of the organic light emitting display of FIG. 4C, taken along the line d-d.

One design and fabrication consideration in OLED devices is that certain organic material layers of OLED devices can suffer damage or accelerated deterioration from exposure to water, oxygen or other harmful gases. Accordingly, it is generally understood that OLED devices be sealed or encapsulated to inhibit exposure to moisture and oxygen or other harmful gases found in a manufacturing or operational environment. FIG. 4D schematically illustrates a cross-section of an encapsulated OLED device 1011 having a layout of FIG. 4C and taken along the line d-d of FIG. 4C. In this embodiment, a generally planar top plate or substrate 1061 engages with a seal 1071 which further engages with a bottom plate or substrate 1002 to enclose or encapsulate the OLED pixel array 1021. In other embodiments, one or more layers are formed on the top plate 1061 or bottom plate 1002, and the seal 1071 is coupled with the bottom or top substrate 1002, 1061 via such a layer. In the illustrated embodiment, the seal 1071 extends along the periphery of the OLED pixel array 1021 or the bottom or top plate 1002, 1061.

In embodiments, the seal 1071 is made of a frit material as will be further discussed below. In various embodiments, the top and bottom plates 1061, 1002 comprise materials such as plastics, glass and/or metal foils which can provide a barrier to passage of oxygen and/or water to thereby protect the OLED pixel array 1021 from exposure to these substances. In embodiments, at least one of the top plate 1061 and the bottom plate 1002 are formed of a substantially transparent material.

To lengthen the life time of OLED devices 1011, it is generally desired that seal 1071 and the top and bottom plates 1061, 1002 provide a substantially non-permeable seal to oxygen and water vapor and provide a substantially hermetically enclosed space 1081. In certain applications, it is indicated that the seal 1071 of a frit material in combination with the top and bottom plates 1061, 1002 provide a barrier to oxygen of less than approximately $10^{-3}$ cc/m$^2$-day and to water of less than $10^{-6}$ g/m$^2$-day. Given that some oxygen and moisture can permeate into the enclosed space 1081, in some embodiments, a material that can take up oxygen and/or moisture is formed within the enclosed space 1081.

The seal 1071 has a width W, which is its thickness in a direction parallel to a surface of the top or bottom substrate 1061, 1002 as shown in FIG. 4D. The width varies among embodiments and ranges from about 300 μm to about 3000 μm, optionally from about 500 μm to about 1500 μm. Also, the width may vary at different positions of the seal 1071. In some embodiments, the width of the seal 1071 may be the largest where the seal 1071 contacts one of the bottom and top substrate 1002, 1061 or a layer formed thereon. The width may be the smallest where the seal 1071 contacts the other. The width variation in a single cross-section of the seal 1071 relates to the cross-sectional shape of the seal 1071 and other design parameters.

The seal 1071 has a height H, which is its thickness in a direction perpendicular to a surface of the top or bottom substrate 1061, 1002 as shown in FIG. 4D. The height varies among embodiments and ranges from about 2 μm to about 30 μm, optionally from about 10 μm to about 15 μm. Generally, the height does not significantly vary at different positions of the seal 1071. However, in certain embodiments, the height of the seal 1071 may vary at different positions thereof.

In the illustrated embodiment, the seal 1071 has a generally rectangular cross-section. In other embodiments, however, the seal 1071 can have other various cross-sectional shapes such as a generally square cross-section, a generally trapezoidal cross-section, a cross-section with one or more rounded edges, or other configuration as indicated by the needs of a given application. To improve hermeticity, it is generally desired to increase the interfacial area where the seal 1071 directly contacts the bottom or top substrate 1002, 1061 or a layer formed thereon. In some embodiments, the shape of the seal can be designed such that the interfacial area can be increased.

The seal 1071 can be arranged immediately adjacent the OLED array 1021, and in other embodiments, the seal 1071 is spaced some distance from the OLED array 1021. In certain embodiment, the seal 1071 comprises generally linear segments that are connected together to surround the OLED array 1021. Such linear segments of the seal 1071 can extend, in certain embodiments, generally parallel to respective boundaries of the OLED array 1021. In other embodiment, one or more of the linear segments of the seal 1071 are arranged in a non-parallel relationship with respective boundaries of the OLED array 1021. In yet other embodiments, at least part of the seal 1071 extends between the top plate 1061 and bottom plate 1002 in a curvilinear manner.

As noted above, in certain embodiments, the seal 1071 is formed using a frit material or simply "frit" or glass frit," which includes fine glass particles. The frit particles includes one or more of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate, etc. In embodiments, these particles range in size from about 2 μm to about 30 μm, optionally about 5 μm to about 10 μm, although not limited only thereto. The particles can be as large as about the distance between the top and bottom substrates 1061, 1002 or any layers formed on these substrates where the frit seal 1071 contacts.

The frit material used to form the seal 1071 can also include one or more filler or additive materials. The filler or additive materials can be provided to adjust an overall thermal expansion characteristic of the seal 1071 and/or to adjust the absorption characteristics of the seal 1071 for selected frequencies of incident radiant energy. The filler or additive material(s) can also include inversion and/or additive fillers to adjust a coefficient of thermal expansion of the frit. For example, the filler or additive materials can include transition metals, such as chromium (Cr), iron (Fe), manganese (Mn), cobalt (Co), copper (Cu), and/or vanadium. Additional materials for the filler or additives include $ZnSiO_4$, $PbTiO_3$, $ZrO_2$, eucryptite.

In embodiments, a frit material as a dry composition contains glass particles from about 20 to 90 about wt %, and the remaining includes fillers and/or additives. In some embodiments, the frit paste contains about 10-30 wt % organic materials and about 70-90% inorganic materials. In some embodiments, the frit paste contains about 20 wt % organic materials and about 80 wt % inorganic materials. In some embodiments, the organic materials may include about 0-30 wt % binder(s) and about 70-100 wt % solvent(s). In some embodiments, about 10 wt % is binder(s) and about 90 wt % is solvent(s) among the organic materials. In some embodiments, the inorganic materials may include about 0-10 wt % additives, about 20-40 wt % fillers and about 50-80 wt % glass powder. In some embodiments, about 0-5 wt % is additive(s), about 25-30 wt % is filler(s) and about 65-75 wt % is the glass powder among the inorganic materials.

In forming a frit seal, a liquid material is added to the dry frit material to form a fit paste. Any organic or inorganic solvent with or without additives can be used as the liquid material. In embodiments, the solvent includes one or more organic compounds. For example, applicable organic compounds are ethyl cellulose, nitro cellulose, hydroxylpropyl cellulose, butyl carbitol acetate, terpineol, butyl cellusolve, acrylate compounds. Then, the thus formed frit paste can be applied to form a shape of the seal 1071 on the top and/or bottom plate 1061, 1002.

In one exemplary embodiment, a shape of the seal 1071 is initially formed from the fit paste and interposed between the top plate 1061 and the bottom plate 1002. The seal 1071 can in certain embodiments be pre-cured or pre-sintered to one of the top plate and bottom plate 1061, 1002. Following assembly of the top plate 1061 and the bottom plate 1002 with the seal 1071 interposed therebetween, portions of the seal 1071 are selectively heated such that the frit material forming the seal 1071 at least partially melts. The seal 1071 is then allowed to resolidify to form a secure joint between the top plate 1061 and the bottom plate 1002 to thereby inhibit exposure of the enclosed OLED pixel array 1021 to oxygen or water.

In embodiments, the selective heating of the frit seal is carried out by irradiation of light, such as a laser or directed infrared lamp. As previously noted, the frit material forming the seal 1071 can be combined with one or more additives or filler such as species selected for improved absorption of the irradiated light to facilitate heating and melting of the frit material to form the seal 1071.

Figure 4E:
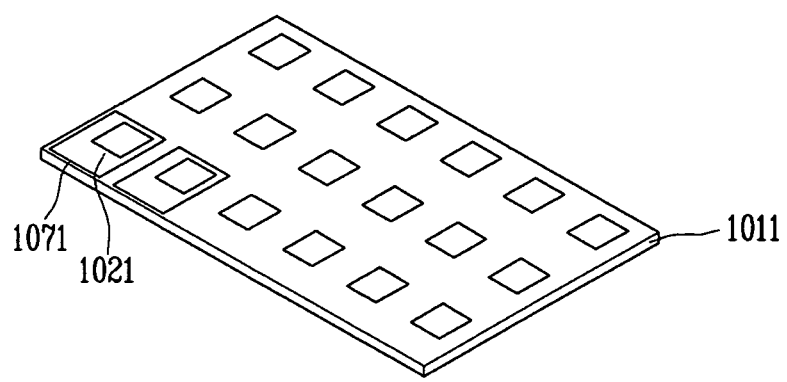
FIG. 4E is a schematic perspective view illustrating mass production of organic light emitting devices in accordance with one embodiment.

In some embodiments, OLED devices 1011 are mass produced. In an embodiment illustrated in FIG. 4E, a plurality of separate OLED arrays 1021 is formed on a common bottom substrate 1101. In the illustrated embodiment, each OLED array 1021 is surrounded by a shaped frit to form the seal 1071. In embodiments, common top substrate (not shown) is placed over the common bottom substrate 1101 and the structures formed thereon such that the OLED arrays 1021 and the shaped frit paste are interposed between the common bottom substrate 1101 and the common top substrate. The OLED arrays 1021 are encapsulated and sealed, such as via the previously described enclosure process for a single OLED display device. The resulting product includes a plurality of OLED devices kept together by the common bottom and top substrates. Then, the resulting product is cut into a plurality of pieces, each of which constitutes an OLED device 1011 of FIG. 4D. In certain embodiments, the individual OLED devices 1011 then further undergo additional packaging operations to further improve the sealing formed by the frit seal 1071 and the top and bottom substrates 1061, 1002.

Generally, when using a frit seal, the top and bottom substrates can be arranged such that the distance between the substrates is smaller than when using other sealing techniques. The small distances between the top and bottom substrates that can be formed by frit technology may result in Newton's rings on display surfaces. Also, the top substrate may form a curvature due to its own load. More specifically, the distance between the top and bottom substrates may be smaller in the central area than the peripheral areas. As such, in certain embodiments, the distance between the top and bottom substrates may not be uniform through out. Also, a curvature in the top substrate or a non-uniform distance between the top and bottom substrates may create Newton's rings on a display surface. As the Newton's rings generally interfere with high quality image display, it is desirable to avoid Newton's rings.

Figure 1:
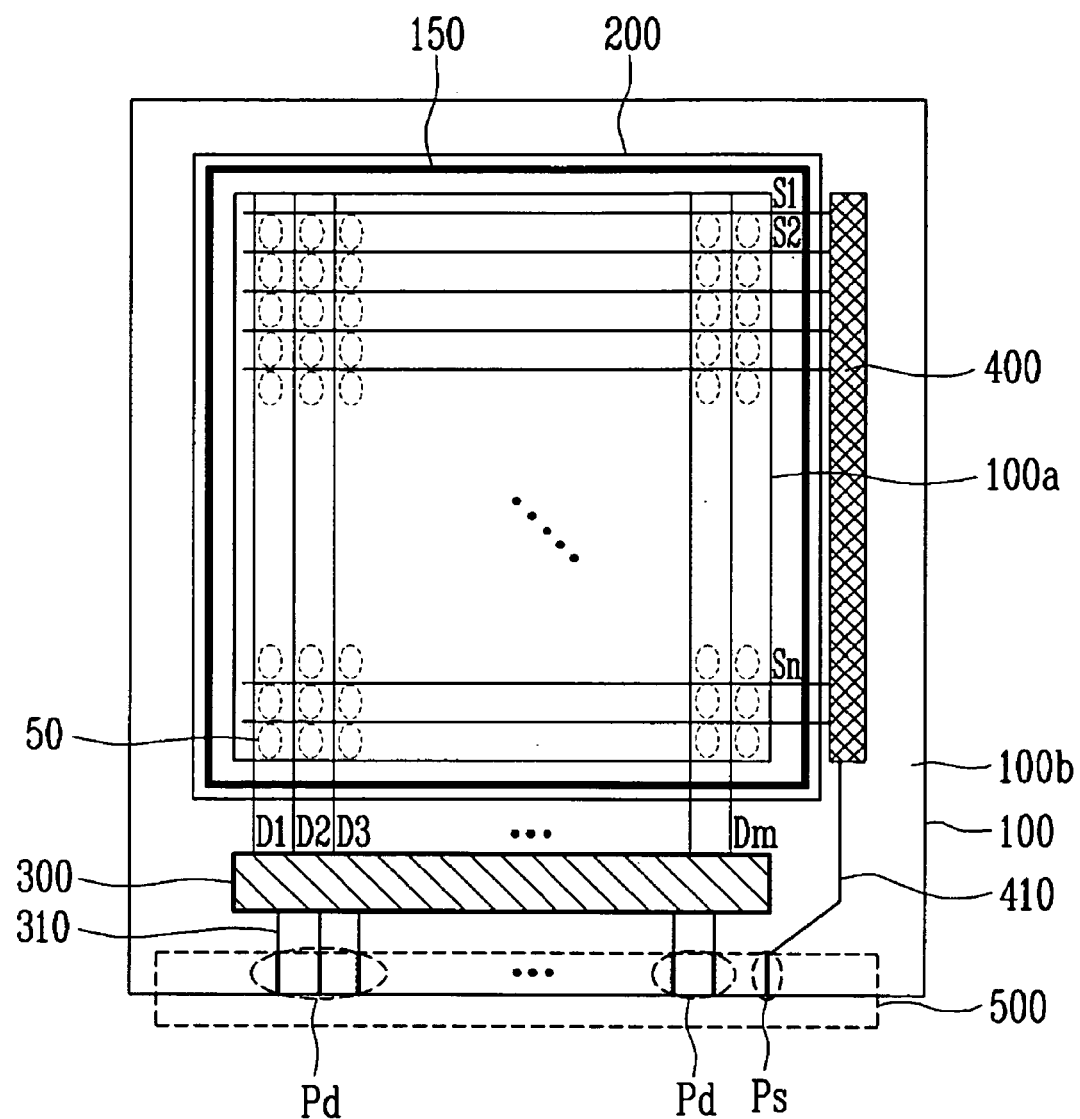
FIG. 1 is a schematic plan view illustrating an organic light emitting display according to an embodiment of the present invention.

FIG. 1 is a plan view illustrating an organic light emitting display according to an embodiment of the present invention. Referring to FIG. 1, the organic light emitting display according to the present invention includes a first or bottom substrate 100, a frit 150, a second or top substrate 200, and a reflection prevention layer 210. The first substrate 100 includes a pixel region 100a and a non-pixel region 100b. The pixel region 100a includes a plurality of scan lines S1, S2, ..., and Sn and a plurality of data lines D1, D2, ..., and Dm so that a plurality of pixels 50 are provided in the regions that are defined by the scan lines S1, S2, ..., and Sn and the data lines D1, D2, ..., and Dm. At this time, each of the pixels 50 is connected to each of the scan lines S1, S2, ..., and Sn and each of the data lines D1, D2, ..., and Dm and each of power source lines (not shown) to display one of red, green, blue, and white with a predetermined brightness level. Therefore, the pixel region 100a displays a predetermined image in accordance with the color and brightness of each of the pixels 50. The non-pixel region 100b is formed beside the pixel region 100a to represent all of the regions excluding the pixel region 100a on the first substrate 100. On the other hand, the non-pixel region 100b includes a data driver 300, a scan driver 400, and a pad unit 500.

The data driver 300 supplies data signals to the plurality of data lines D1, D2, ..., and Dm that extend in the pixel region 100a on the first substrate 100. The data driver 300 is formed on one side of the pixel region 100a on the first substrate 100 and on the other side adjacent to the one side of the pixel region 100a in which the scan driver 400 is formed. At this time, the data driver 300 is mounted on the first substrate 100 by a chip on glass (COG) method in the form of a chip. Also, the data driver 300 is connected to a plurality of first pads Pd in the pad unit 500 by a plurality of data supply lines 310.

The scan driver 400 sequentially supplies scan signals to the plurality of scan lines S1, S2, ..., and Sn that extend in the pixel region 100a. The scan driver 400 is formed on one side of the pixel region 100a on the first substrate 100 and is connected to at least one first pad Ps in the pad unit 500 by at least one scan supply line 410. The pad unit 500 is adjacent to the scan driver 400 and the data driver 300 on the first substrate 100 and is electrically connected to the scan supply line 410 and the data supply line 310 to supply electrical signals to the plurality of scan lines S1, S2, . . . , and Sn and the plurality of data lines D1, D2, . . . , and Dm in the pixel region 100a.

The frit 150 is provided between the non-pixel region 100b of the first substrate 100 and the second substrate 200 to attach the first substrate 100 and the second substrate 200 to each other. The organic light emitting display device has a gap between the first surface of the array and the inner surface of the second substrate. Generally, the size of the gap depends on the height of the seal interconnecting two substrates. The frit seal, among other forms of sealing, allows the gap size significantly smaller than others. For example, when using frit seal, the gap size (the distance between the array and the second substrate) can be in the order of a few to several hundred μm. When the gap size is in this range, dark rings called Newton's rings may be formed on the display surface due to optical interference created by light incident to the display surface. More specifically, when the gap size is about or less than 10 μm, the possibility of Newton's rings may increase. Thus, in packaging an organic light emitting display device with the frit seal, the configuration for avoiding Newton's rings can be a design factor.

As illustrated in FIG. 1, the frit 150 is formed to seal the pixel region 100a formed on the first substrate 100 and may be applied to seal the pixel region 100a and the scan driver 400 when the scan driver 400 is built-in. That is, since the gap between the first substrate 100 and the second substrate 200 is sealed by the frit 150, an array of organic light emitting diodes or pixels that are interposed between the first substrate 100 and the second substrate 200 are protected against moisture and oxygen. At this time, the frit 150 includes a filler (not shown) for controlling a thermal expansion coefficient and an absorbent (not shown) that absorbs laser or infrared rays. Also, the frit 150 is melted by irradiating of the laser or infrared rays onto the frit 150 and resolidified. At this time, the intensity of the laser radiated onto the frit 150 is in the range of about 25 W to about 60 W.

In one embodiment, when the temperature of the heat applied to glass is rapidly reduced, a frit in the form of glass powders is generated. In general, oxide powders are added to the glass powders to be used. When an organic material is added to the frit, a gel-type paste is obtained. When the gel-type paste is sintered or baked at a predetermined temperature, the organic material is extinguished in the air and the gel-type paste is hardened so that a glass fit is obtained. The temperature at which the fit 150 is baked is in the range of about 300° C. to about 700° C.

The second substrate 200 is joined to the first substrate by a frit that surrounds the pixel region 100a. At this time, the second substrate 200 is provided to prevent the organic light emitting diodes or pixels (not shown) formed on the pixel region 100a on the first substrate 100 from being affected by moisture and oxygen from the outside. At this time, although not limited thereto, the second substrate 200 may be formed of a material selected from the group consisting of $SiO_2$, SiNx, and SiOxNy.

Figure 2:
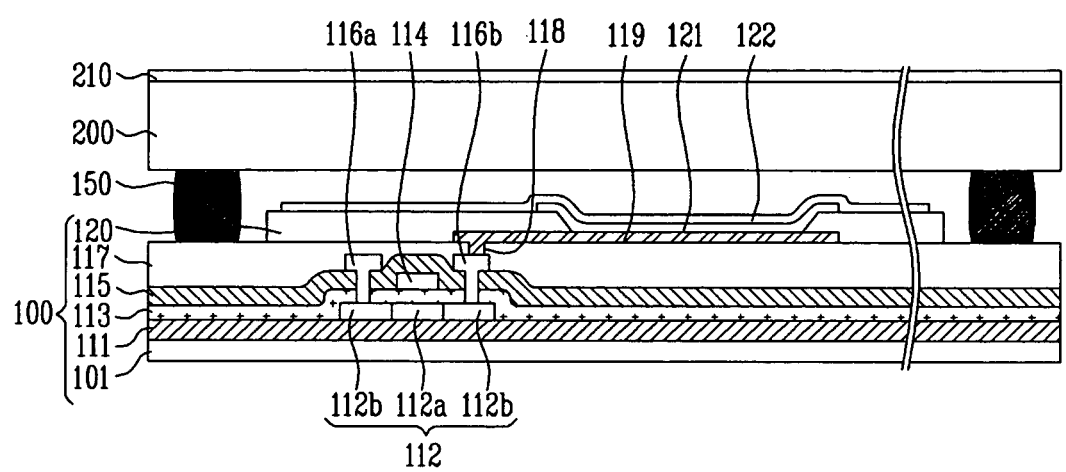
FIG. 2 is a sectional view illustrating the organic light emitting display according to an embodiment of the present invention.

The reflection prevention layer or antireflection layer 210 may be formed on the top surface of the second substrate 200 as illustrated in FIG. 2 or may be formed on the bottom surface or on both of the top and bottom surfaces of the second substrate 200 although not shown in the drawing. At this time, the reflection prevention layer 210 reduces light incident through the second substrate 200 from being reflected to prevent Newton's rings from being generated between the first substrate 100 and the second substrate 200. That is, when load is applied to the second substrate 200, the second substrate 200 may have a curvature so that the distance between the first substrate 100 and the second substrate 200 may not be uniform. Therefore, Newton's rings may be generated due to interference between the reflected lights, that is caused by differences in the distance between the first substrate 100 and the second substrate 200. Newton's rings may be concentric circles and the Newton's rings may be shown in display surfaces. The Newton's rings can generated when the distance between the first substrate 100 and the second substrate 200 is sufficiently small. Since the characteristics of the display may deteriorate due to the Newton's rings, in order to prevent the Newton's rings from being generated, the reflection prevention layer 210 that reduces the reflectance of the incident light is formed. The reflection prevention layer 210 may be formed of a single layer of a plurality of layers. When the reflection prevention layer 210 is formed of the single layer, the reflection prevention layer 210 is made of at least one material selected from the group consisting of $MgF_2$, NaF, and $AlF_3$. When the reflection prevention layer 210 is formed of the plurality of layers, the reflection prevention layer 210 is made of at least one material selected from the group consisting of $ZnS/SiO_2$ and $TiO_2/SiO_2$. The materials of which the reflection prevention layer 210 is made and the reflectance thereof are illustrated in Table 1.

TABLE 1

| Single layer | Reflectance | A plurality of layers | Reflectance |
|---|---|---|---|
| $MgF_2$ | 1.24% | $ZnS/SiO_2$ | 0.13% |
| NaF | 0.27% | $TiO_2/SiO_2$ | 0.21% |
| $AlF_3$ | 1.57% | | |

The reflectance of the second substrate 200 is generally about 4% when the reflection layer is not formed. Therefore, since it is possible to prevent the Newton's rings from being generated when the reflectance of the incident light is reduced according to the present invention, the reflection prevention layer 210 having the reflectance smaller than 4% can be formed on at least one side of the second substrate 200. The reflectance of the reflection prevention layer 210 is smaller when the reflection prevention layer 210 is made of a plurality of layers than when the reflection prevention layer 210 is made of the single layer. As illustrated in the Table 1, it is preferable to use the reflection prevention layer 210 obtained by laminating $ZnS/SiO_2$.

FIG. 2 is a sectional view illustrating the organic light emitting display according to the present invention. Referring to FIG. 2, in the illustrated embodiment, the organic light emitting display according to the present invention includes the first substrate 100, the second substrate 200, and the reflection prevention layer 210. The first substrate 100 includes a deposition substrate 101 and at least one organic light emitting diode 110 formed on the deposition substrate 101. First, a buffer layer 111 is formed on the deposition substrate 101. The deposition substrate 101 is formed of glass and the buffer layer 111 is formed of an insulating material such as $SiO_2$ and SiNx. On the other hand, the buffer layer 111 is formed to prevent the deposition substrate 101 from being damaged by factors such as heat from the outside. A semiconductor layer 112 that includes an active layer 112a and ohmic contact layers 112b is formed on at least one region of the buffer layer 111. A gate insulation layer 113 is formed on the buffer layer 111 and the semiconductor layer 112. A gate electrode 114 of the size corresponding to the width of an active layer 112a is formed on one region of the gate insulation layer 113.

An interlayer insulation layer 115 is formed on the gate insulation layer 113 and the gate electrode 114. Source and drain electrodes 116a and 116b are formed on a predetermined region of the interlayer insulation layer 115. Each of the source and drain electrodes 116a and 116b is connected to one exposed region of each of the ohmic contact layers 112b. A planarization layer 117 is formed on the interlayer insulation layer 115 to include the source and drain electrodes 116a and 116b. A first electrode 119 is formed on one region of the planarization layer 117. At this time, the first electrode 119 is connected to one exposed region of one of the source and drain electrodes 116a and 116b by a via hole 118. A pixel definition layer 120 including an aperture (not shown) that exposes at least one region of the first electrode 119 is formed on the planarization layer 117 to include the first electrode 119. An organic layer 121 is formed on the aperture of the pixel definition layer 120 and a second electrode layer 122 is formed on the pixel definition layer 120 to include the organic layer 121.

In embodiments, the second substrate 200 is attached to the first substrate 100 by the frit 150 with predetermined structures interposed in order to protect the predetermined structures formed on the first substrate 100 against the oxygen and moisture from the outside. At this time, although not limited thereto, the second substrate 200 may be formed of at least one selected from the group consisting of $SiO_2$, SiNx, and SiOxNy. The frit 150 is provided between the non-pixel region (not shown) of the first substrate 100 and the second substrate 200 to interconnect the first substrate 100 and the second substrate 200. At this time, the frit 150 is applied so that the pixel region (not shown) formed on the first substrate 100 is sealed or encapsulated and may be applied so that the pixel region and the scan driver are sealed up when the scan driver (not shown) is formed.

In one embodiment, the reflection prevention layer 210 may be formed on the top surface of the second substrate 200 as illustrated in FIG. 2. In another embodiment, the reflection prevention layer 210 may be formed on the bottom surface or on both of the top and bottom surfaces of the second substrate 200 although not shown in the drawing. At this time, the reflection prevention layer 210 reduces the light incident through the second substrate 200 from being reflected to prevent the Newton's rings from being generated between the first substrate 100 and the second substrate 200. On the other hand, the reflection prevention layer 210 may be formed of the single layer or the plurality of layers. When the reflection prevention layer 210 is formed of the single layer, the reflection prevention layer 210 is made of at least one material selected from the group consisting of $MgF_2$, NaF, and $AlF_3$. When the reflection prevention layer 210 is formed of the plurality of layers, the reflection prevention layer 210 is made of at least one material selected from the group consisting of $ZnS/SiO_2$ and $TiO_2/SiO_2$.

Figure 3:
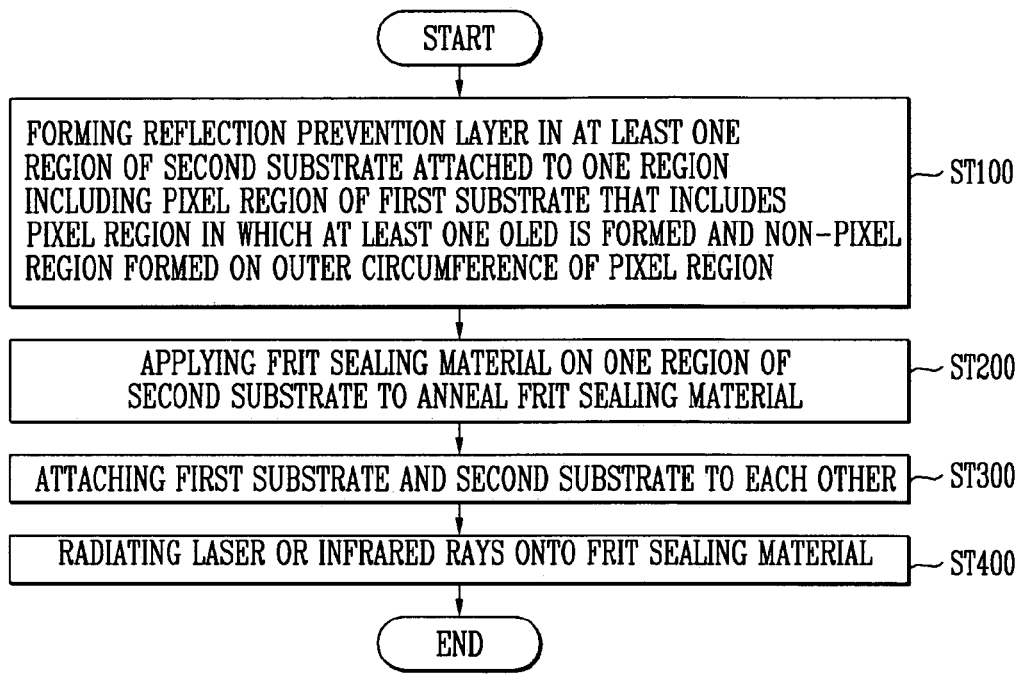
FIG. 3 is a flowchart illustrating a method of fabricating the organic light emitting display according to an embodiment of the present invention.

FIG. 3 is a flowchart illustrating a method of fabricating the organic light emitting display according to the present invention. Referring to FIG. 3, a method of packaging the organic light emitting display according to the present invention includes a first ST100, a second step ST200, a third step ST300, and a fourth step ST400. In the first step ST100 of the method of fabricating the organic light emitting display, the first substrate including the pixel region in which at least one organic light emitting diode is formed and the non-pixel region formed in the outer circumference of the pixel region is provided. The second substrate with the reflection prevention layer formed on the top surface or/and the bottom surface is provided. In an embodiment, the reflection prevention layer may control the reflection angle of the light incident through the second substrate to prevent the Newton's rings from being generated. Due to the load of the second substrate, the second substrate may have a curvature so that the distance between the first substrate and the second substrate is not uniform. The Newton's rings may be generated due to the difference of the distance between the first substrate and the second substrate. The reflection prevention layer is formed to reduce the reflectance of the incident light and thus prevents the Newton's rings. In certain embodiments, the reflection prevention layer may be formed of the single layer or the plurality of layers. When the reflection prevention layer is formed of the single layer, the reflection prevention layer is made of at least one material selected from the group consisting of $MgF_2$, NaF, and $AlF_3$. When the reflection prevention layer is formed of the plurality of layers, the reflection prevention layer is made of at least one material selected from the group consisting of $ZnS/SiO_2$ and $TiO_2/SiO_2$.

In the second step ST200, the frit is applied to one region of the second substrate to be sintered. At this time, the frit is interposed between the second substrate and the non-pixel region. Also, the frit is applied so that the pixel region formed on the first substrate is sealed up and may be applied so that the pixel region and the scan driver are sealed up when the scan driver is built-in. Here, the frit includes a filler for controlling a thermal expansion coefficient and an absorbent that absorbs laser or infrared rays. On the other hand, when the temperature of the heat applied to glass is rapidly reduced, the frit in the form of glass powders is generated. In general, the oxide powders are added to the frit to be used. When the organic material is added to the frit in which the oxide powders are included, the gel-type paste is obtained. The gel-type paste is applied along the sealing line of the second substrate. Then, when thermal treatment is performed on the frit at a predetermined temperature, the organic material is extinguished in the air and the gel-type paste is hardened so that the glass frit is obtained. At this time, the temperature at which the frit is sintered is preferable in the range of about 300° C. to about 700° C.

In the third step ST300, the first substrate and the second substrate are attached to each other. At this time, the first substrate and the second substrate are attached to each other so that the organic light emitting diode formed on the first substrate is encapsulated. In the fourth step ST400, the frit is melted so that the first substrate and the second substrate are adhered to each other. The frit is melted by irradiating the laser or infrared rays onto the frit. At this time, the preferable intensity of the laser for melting the frit is in the range of about 25 W to about 60 W. The frit is melted to bond the first substrate and the second substrate to each other.

In the organic light emitting display according to the present invention and the method of manufacturing the same, it is possible to prevent the Newton's rings from being generated due to the small distance between the substrate and the sealing substrate. The frit seal is used for adhering the deposition substrate and the sealing substrate to each other so that it is possible to completely protect the organic light emitting diode.

Although a few embodiments of the present invention have been shown and described, it would be appreciated by those skilled in the art that changes might be made in this embodiment without departing from the principles and spirit of the invention, the scope of which is defined in the claims and their equivalents.

What is claimed is:
1. An organic light emitting display device, comprising:
   a first substrate comprising a single layer or multiple layers;
   a second substrate comprising a single layer or multiple layers, the second substrate comprising an inner surface facing the first substrate and an outer surface facing away from the first substrate;

an array of organic light emitting pixels formed on the first substrate and interposed between the first and second substrates, the array comprising a top surface opposing the inner surface of the second substrate, wherein the top surface and the inner surface has a gap therebetween with a gap distance smaller than about 300 μm;

a frit seal interconnecting the first and second substrates while surrounding the array, wherein the frit seal, the first substrate and the second substrate in combination define a sealed enclosed space in which the array is located such that the gap distance is smaller than about 300 μm; and an antireflection layer formed over at least one of the inner and outer surfaces of the second substrate, wherein the antireflection layer consists of a single layer of $AlF_3$.

2. The device of claim 1, wherein the gap distance is smaller than about 100 μm.

3. The device of claim 1, wherein the gap distance is smaller than about 10 μm.

4. The device of claim 1, wherein the gap distance is from about 150 μm to about 3 μm.

5. The device of claim 1, wherein the antireflection layer forms on the outer surface of the second substrate.

6. The device of claim 1, wherein the antireflection layer forms on the inner surface of the second substrate.

7. The device of claim 1, wherein the array is configured to emit visible light through the top surface.

8. The device of claim 1, wherein the frit seal comprises one or more materials selected from the group consisting of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate.

9. A method of making an organic light emitting display device, the method comprising:
providing an unfinished device comprising a first substrate and an array of organic light emitting pixels formed on the first substrate, the array comprising a top surface facing away from the first substrate;
providing a second substrate and an antireflection layer, the second substrate comprises an inner surface and an outer surface, wherein the antireflection layer is formed on at least one of the inner and outer surfaces, and the antireflection layer consists of a single layer of $AlF_3$;
arranging the second substrate over the unfinished device such that the inner surface opposes the array and that the array is interposed between the first and second substrates, wherein the array and the inner surface forms a gap therebetween; and
forming a frit seal between and interconnecting the first and second substrates while surrounding the array in an enclosed space such that the gap distance is smaller than about 300 μm.

10. The method of claim 9, wherein forming the fit seal comprises:
interposing a fit material between the first and second substrate; and
bonding the frit material to the first and second substrate so as to form a substantially hermetic seal.

11. The method of claim 9, wherein the frit seal has a height measured between the first and second substrate, wherein the height is from about 2 μm to about 30 μm.

12. The method of claim 9, wherein the gap distance is about 3 to about 150 μm.

13. The method of claim 9, wherein the gap distance is smaller than 10 μm.

14. The method of claim 9, wherein the organic light emitting device is configured to display an image on the outer surface substantially free of Newton's rings.

15. The method of claim 9, wherein the unfinished device further comprises a plurality of additional arrays of organic light emitting pixels formed on the first substrate, wherein the method further comprises forming a plurality of additional seals between and interconnecting the first and second substrates, wherein a first one of the additional seals surrounds a first one of the additional arrays.

16. The method of claim 15, wherein the first additional array and the second substrate forms a gap therebetween with a gap distance smaller than about 300 μm.

* * * * *